(12) United States Patent
Malhotra et al.

(10) Patent No.: US 11,546,127 B2
(45) Date of Patent: Jan. 3, 2023

(54) SYSTEMS AND METHODS FOR SYMBOL-SPACED PATTERN-ADAPTABLE DUAL LOOP CLOCK RECOVERY FOR HIGH SPEED SERIAL LINKS

(71) Applicant: Samsung Display Co., Ltd., Yongin-si (KR)

(72) Inventors: Gaurav Malhotra, Cupertino, CA (US); Amir Amirkhany, Sunnyvale, CA (US); Jalil Kamali, San Jose, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/508,898

(22) Filed: Oct. 22, 2021

(65) Prior Publication Data

US 2022/0303110 A1 Sep. 22, 2022

Related U.S. Application Data

(60) Provisional application No. 63/227,605, filed on Jul. 30, 2021, provisional application No. 63/162,883, filed on Mar. 18, 2021.

(51) Int. Cl.
*H04L 25/49* (2006.01)
*H04L 7/00* (2006.01)
*H03L 7/08* (2006.01)

(52) U.S. Cl.
CPC .......... *H04L 7/0016* (2013.01); *H03L 7/0807* (2013.01)

(58) Field of Classification Search
CPC ............ H04L 7/0016; H04L 25/03057; H04L 25/03146; H04L 7/0062; H04L 25/061;
(Continued)

(56) References Cited

U.S. PATENT DOCUMENTS 5,412,687 A 5/1995 Sutton et al.
7,356,095 B2 4/2008 Dagdeviren et al.
(Continued)

FOREIGN PATENT DOCUMENTS

CN 106656168 5/2017

OTHER PUBLICATIONS

Malhotra, Gaurav, et al., "Symbol spaced clock recovery for high speed links," 2019 13th International Conference on Signal Processing and Communication Systems, IEEE, Dec. 2019, 5 pages.
(Continued)

*Primary Examiner* — Phuong Phu
(74) *Attorney, Agent, or Firm* — Lewis Roca Rothgerber Christie LLP

(57) ABSTRACT

A clock recovery circuit may include: a data slicer configured to output data values based on an input signal, a first error block, a phase adjustment loop including: a first error slicer configured to generate a first error signal based on a comparison of a threshold voltage and an input voltage, wherein the first error block is configured to selectively output the first error signal in response to a first pattern in the output data values, a second error block configured to selectively output the first error signal in response to a second pattern in the output data values, and a voltage threshold modification circuitry configured to adjust the threshold voltage based on output of the second error block, a voltage-controlled oscillator, wherein the data slicer and the first error slicer are clocked based on output of the voltage-controlled oscillator.

20 Claims, 6 Drawing Sheets

(58) Field of Classification Search
CPC ............ H04L 7/0334; H04L 25/03878; H04L 7/0058; G01R 13/0272; H03L 7/0807
USPC .................. 375/293, 294, 371, 373–376, 327
See application file for complete search history.

(56) References Cited

U.S. PATENT DOCUMENTS

| | | | |
|---|---|---|---|
| 7,554,412 B2 | 6/2009 | Kojima et al. | |
| 7,983,370 B2 | 7/2011 | Wada | |
| 8,170,169 B2 | 5/2012 | Martin et al. | |
| 8,189,729 B2 | 5/2012 | Hoang et al. | |
| 8,284,888 B2 | 10/2012 | Kyles | |
| 8,401,064 B1 | 3/2013 | Lin et al. | |
| 8,687,756 B2 | 4/2014 | Sindalovsky et al. | |
| 8,804,889 B2 | 8/2014 | Palusa et al. | |
| 9,031,179 B2 | 5/2015 | Su | |
| 9,036,764 B1 | 5/2015 | Hossain et al. | |
| 9,215,061 B2* | 12/2015 | Hammad | ............... H04L 7/0016 |
| 9,312,865 B2 | 4/2016 | Song et al. | |
| 9,455,848 B1* | 9/2016 | Zhang | ............... H04L 25/03057 |
| 9,654,315 B2* | 5/2017 | Wei | ................... H04L 25/03878 |
| 10,181,941 B1* | 1/2019 | Chen | ..................... H04L 7/0062 |
| 10,277,389 B2 | 4/2019 | Terlemez et al. | |
| 10,277,431 B2 | 4/2019 | Tajalli | |
| 10,454,485 B1 | 10/2019 | Malhotra | |
| 10,686,583 B2 | 6/2020 | Ulrich et al. | |
| 10,693,473 B2 | 6/2020 | Tajalli et al. | |
| 2010/0135378 A1* | 6/2010 | Lin | ....................... H04L 7/0058 375/232 |
| 2011/0292990 A1* | 12/2011 | Flynn | ................. G01R 13/0272 375/229 |
| 2014/0334584 A1 | 11/2014 | Lakkis | |
| 2016/0211965 A1 | 7/2016 | Hammad et al. | |
| 2017/0279428 A1* | 9/2017 | Malhotra | .......... H04L 25/03057 |
| 2018/0262373 A1* | 9/2018 | Shibasaki | ............. H04L 7/0334 |
| 2020/0322189 A1* | 10/2020 | Hormati | ............ H04L 25/03146 |
| 2021/0385060 A1* | 12/2021 | Van Ierssel | ........... H04L 25/061 |

OTHER PUBLICATIONS

EPO Extended European Search Report dated Aug. 5, 2022, issued in corresponding European Patent Application No. 22162967.8 (11 pages).

* cited by examiner

FIG. 3

| CASE # | PRIMARY LOOP | SECONDARY LOOP | LOCK CONDITION |
|---|---|---|---|
| 1 | $\overline{ERROR}|$x1x | $\overline{ERROR}|$011 | $h_1 = h_{-1}$ |
| 2 | $\overline{ERROR}|$x1x | $\overline{ERROR}|$110 | $h_1 = h_{-1}$ |
| 3 | $\overline{ERROR}|$x1x | $\overline{ERROR}|$x10 | $h_1 = 0$ |
| 4 | $\overline{ERROR}|$x1x | $\overline{ERROR}|$01x | $h_{-1} = 0$ |

FIG. 5

| CASE # | PRIMARY LOOP | SECONDARY LOOP | LOCK CONDITION |
|---|---|---|---|
| 1 | $\overline{ERROR}\|x0x$ | $\overline{ERROR}\|100$ | $h_1 = h_{-1}$ |
| 2 | $\overline{ERROR}\|x0x$ | $\overline{ERROR}\|001$ | $h_1 = h_{-1}$ |
| 3 | $\overline{ERROR}\|x0x$ | $\overline{ERROR}\|x01$ | $h_1 = 0$ |
| 4 | $\overline{ERROR}\|x0x$ | $\overline{ERROR}\|10x$ | $h_{-1} = 0$ |

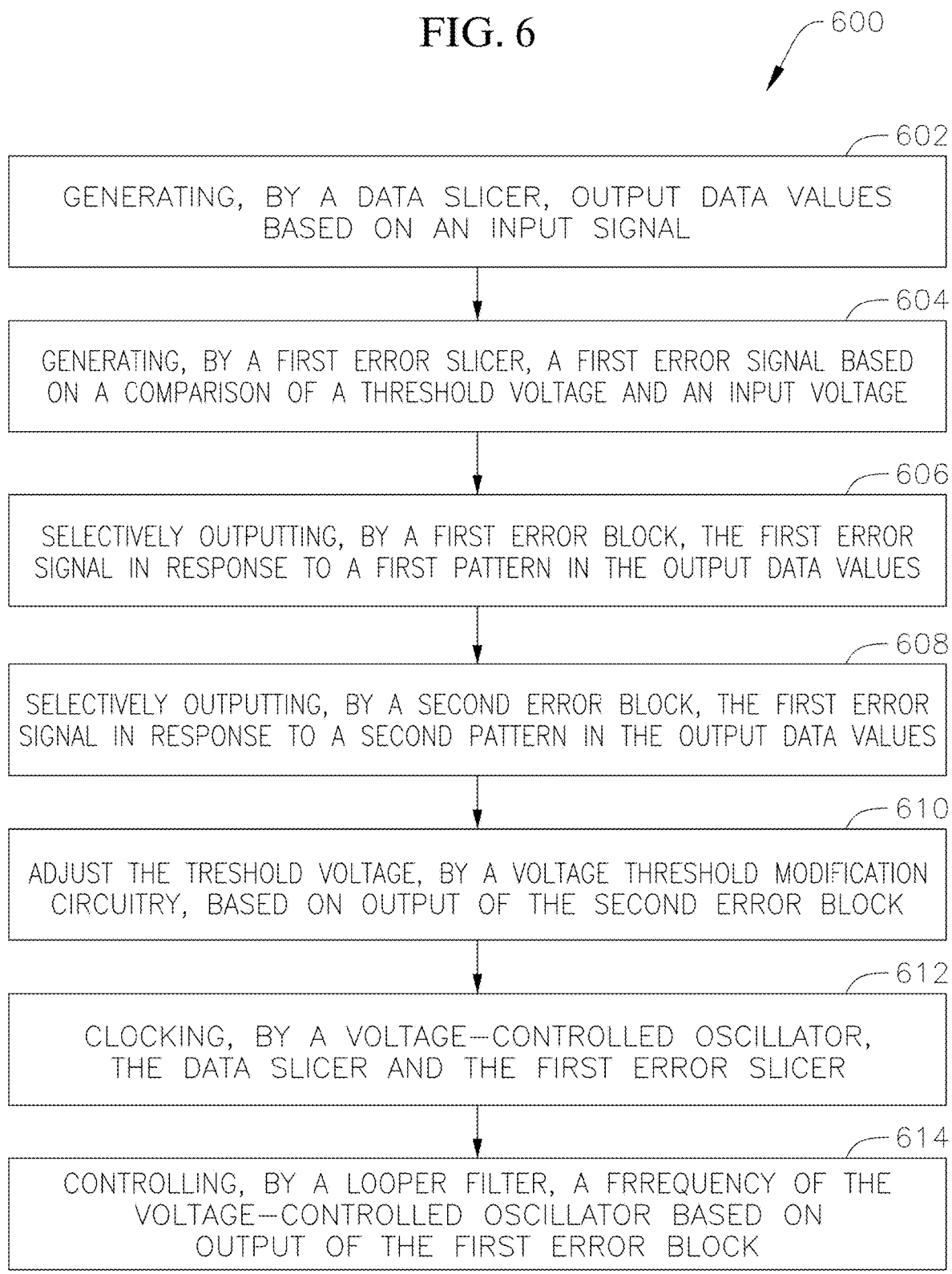

SYSTEMS AND METHODS FOR SYMBOL-SPACED PATTERN-ADAPTABLE DUAL LOOP CLOCK RECOVERY FOR HIGH SPEED SERIAL LINKS

CROSS-REFERENCE TO RELATED APPLICATION(S)

This application claims priority to and the benefit of U.S. Provisional Patent Application No. 63/162,883 filed on Mar. 18, 2021, and U.S. Provisional Patent Application No. 63/227,605 filed on Jul. 30, 2021, which are both incorporated herein by reference in their entirety.

FIELD

The present application generally relates to timing recovery in high speed serial link, and more particularly to systems and methods for symbol-spaced pattern-adaptable dual loop clock recovery for high speed serial links.

BACKGROUND

High speed serial links, often referred to as serialzier/deserializer (SerDes), are used extensively as interfaces in electronic devices such as electronic displays. As increasing amounts of data are transmitted over such high-speed serial links (e.g., as result of increased display resolution, color depth, and/or refresh rates), the interface speed increases accordingly as well. With the increase in speed comes an increase in power and silicon area of a communication receiver of the interface. Timing recovery, or clock and data recovery (CDR) is a critical function in such serial links to ensure proper transmission and receipt of data. Moreover, it desirable to perform timing recovery while saving power, area, and design complexity of the serial interface.

SUMMARY

According to some embodiments, a clock recovery circuit is described. The clock recovery circuit may include: a data slicer configured to output data values based on an input signal, a first error block, a phase adjustment loop including: a first error slicer configured to generate a first error signal based on a comparison of a threshold voltage and an input voltage, wherein the first error block is configured to selectively output the first error signal in response to a first pattern in the output data values, a second error block configured to selectively output the first error signal in response to a second pattern in the output data values, and a voltage threshold modification circuitry configured to adjust the threshold voltage based on output of the second error block, a voltage-controlled oscillator, wherein the data slicer and the first error slicer are clocked based on output of the voltage-controlled oscillator, and a loop filter configured to control a frequency of the voltage-controlled oscillator based on output of the first error block.

The first error signal may be a positive value in response to the input voltage being greater than the threshold voltage, or wherein the first error signal is a negative value in response to the input voltage being equal to or less than the threshold voltage.

The voltage threshold modification circuitry may include a state machine configured to selectively increment the threshold voltage in response to the input voltage of the first error slicer being greater than the threshold voltage.

The input voltage of the first error slicer may be an output of the voltage-controlled oscillator.

The threshold voltage may initially set based on a peak value of the input signal.

The first pattern and the second pattern may be different patterns.

The first pattern and the second pattern may each include 3 bits of the output data values.

The loop filter may be a low-pass filter configured to filter noise from an output signal.

The phase adjustment loop may further include a second error slicer configured to generate a second error signal based on a comparison of a negative value of the threshold voltage and the input voltage.

The first error block may be further configured to selectively output an inverted second error signal in response to a third pattern in the output data values, wherein the third pattern is a complement of the first pattern.

The second error block may be further configured to selectively output the second error signal in response to a fourth pattern in the output data values, wherein the fourth pattern is a complement of the second pattern.

According to some embodiments, a clock recovery method is described. The method may include: generating, by a data slicer, output data values based on an input signal, generating, by a first error slicer, a first error signal based on a comparison of a threshold voltage and an input voltage, selectively outputting, by a first error block, the first error signal in response to a first pattern in the output data values, selectively outputting, by a second error block, the first error signal in response to a second pattern in the output data values, adjusting the threshold voltage, by a voltage threshold modification circuitry, based on output of the second error block, clocking, by a voltage-controlled oscillator, the data slicer and the first error slicer, and controlling, by a loop filter, a frequency of the voltage-controlled oscillator based on output of the first error block.

The first error signal may be a positive value in response to the input voltage being greater than the threshold voltage, or wherein the first error signal is a negative value in response to the input voltage being equal to or less than the threshold voltage.

The adjusting the threshold voltage may further include selectively incrementing the threshold voltage in response to the input voltage of the first error slicer being greater than the threshold voltage.

The input voltage of the first error slicer may be an output of the voltage-controlled oscillator.

The method may further include setting the threshold voltage initially based on a peak value of the input signal.

The first pattern and the second pattern may each includes bits of the output data values.

The method may further include generating, by a second error slicer, a second error signal based on a comparison of a negative value of the threshold voltage and the input signal.

The method may further include selectively outputting, by the first error block, an inverted second error signal in response to a third pattern in the output data values, wherein the third pattern is a complement of the first pattern.

The method may further include selectively outputting, by the second error block, the second error signal in response to a fourth pattern in the output data values, wherein the fourth pattern is a complement of the second pattern.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIG. 3 is a table illustrating example cases for error blocks, according to various embodiments of the present disclosure.

FIG. 5 is a table illustrating another set of example case for error blocks, according to various embodiments of the present disclosure.

FIG. 6 is a flow chart illustrating a method for performing clock recovery, according to various embodiments of the present disclosure.

Figure 1:
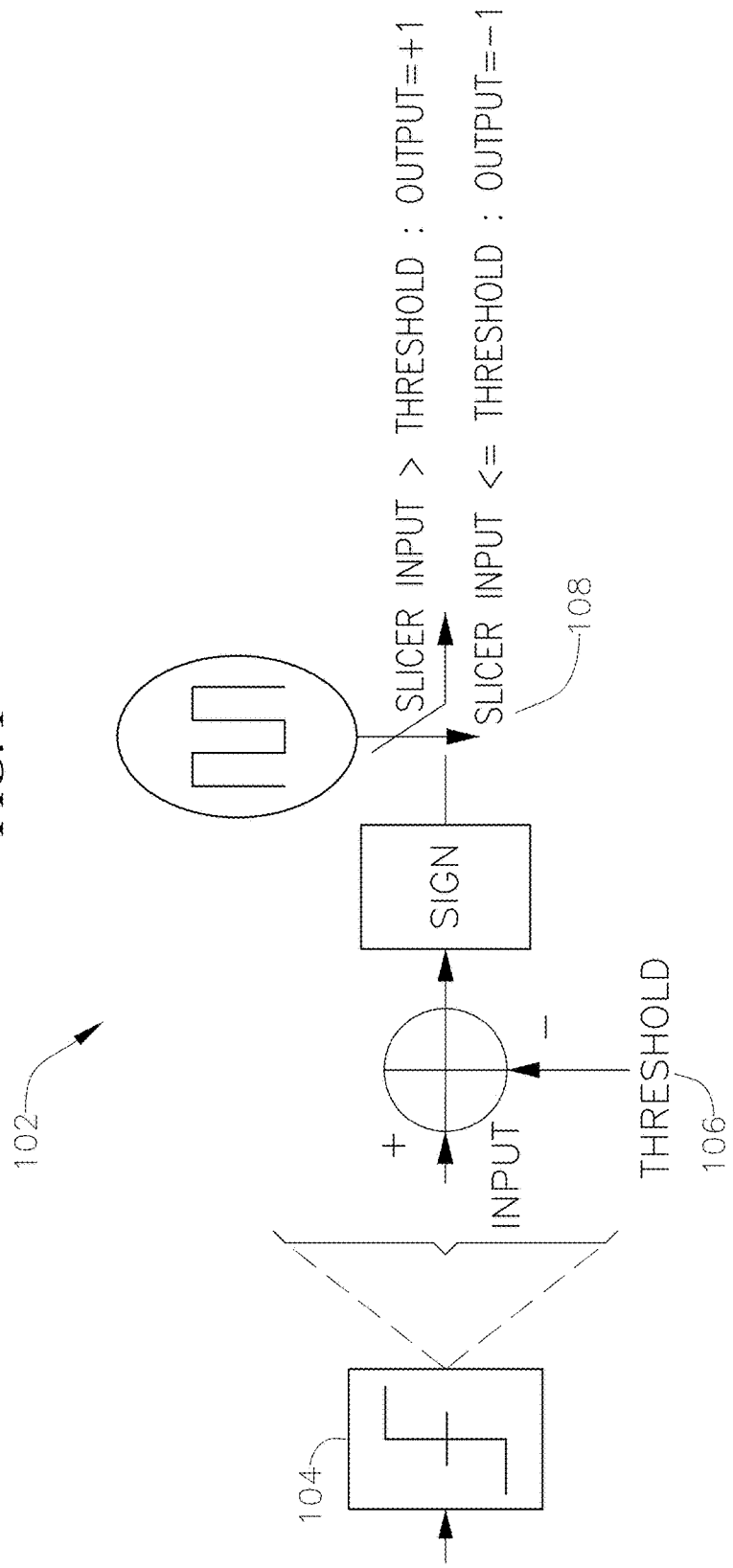
FIG. 1 is a block diagram of an example slicer, according to various embodiments of the present disclosure.

Embodiments of the present disclosure and their advantages are best understood by referring to the detailed description that follows. Unless otherwise noted, like reference numerals denote like elements throughout the attached drawings and the written description, and thus, descriptions thereof will not be repeated. In the drawings, the relative sizes of elements, layers, and regions may be exaggerated for clarity.

DETAILED DESCRIPTION

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

The present disclosure describes techniques for timing recovery or clock data recovery in high speed serial links (SerDes). The SerDes system and method described in the present disclosure utilizes two feedback loops operating off of a single 1-bit sampler, also known as a slicer. The slicer samples the difference in voltage between an incoming input data signal and an offset threshold voltage at the data symbol rate. The first feedback loop, which will be referred to herein as a frequency acquisition loop adapts the threshold voltage, and the second feedback loop, which will be referred to herein as the phase adjustment loop automatically reacts to adjust the sampling phase. Moreover, the described system and method includes data signal bit pattern screening functions to generate an error signal that feeds the two feedback loops, and the clock and data recover (CDR) jointly optimizes the threshold voltage and the sampling phase such that certain target criteria may be achieved. The pattern screening functions may be set to rely on only the current bit value for the frequency acquisition loop that drives a voltage-controlled oscillator (VCO), thereby avoiding the issue of losing frequency lock when the data bits are a repeating 1010 clock pattern. On the other hand, the phase adjustment loop may screen a different set of patterns to optimize the locking phase and achieve various impulse responses. Accordingly, systems and methods for timing recovery are described while saving power, area, and design complexity of the serial interface.

Clock data recovery algorithms fall under two general categories: either oversampled or baud rate (also referred to as symbol spaced). In high speed serial links (SerDes) that utilize oversampled timing recovery, two samples are taken per unit interval (UI) at a spacing or distance of one-half UI between the two samples. One UI may be defined as 1/(Data Rate)=1 symbol time=T. Accordingly, timing information of the signal may be derived using, for example, a well-known early-late algorithm. Although the early-late algorithm is a robust algorithm, the downside is that the receiver has to generate a clock that is twice as fast as the data rate. In systems that utilize baud rate timing recovery, for example, a bang-bang or a Mueller-Muller approach which are popular clock recovery techniques used in many digital receivers (e.g., analog-to-digital converter (ADC) based receivers), only one sample is taken per UI. However, this technique requires obtaining samples from at least 2 UIs to derive the timing error information and is generally implemented in the digital domain. Accordingly, such known techniques require additional clock phases and additional slicers, all of which result in increased power consumption.

Embodiments of the present disclosure describe techniques for performing timing recovery or clock and data recovery (CDR) where just one sample is taken per UI by using only the sign of the error and not the magnitude, and also does not rely on an ADC. Additionally, whereas in some techniques, frequency lock is lost when certain patterns are transmitted to the receiver (e.g., a clock pattern such as 1010), the embodiments of the present disclosure provide techniques that can acquire a frequency lock for all types of data patterns, including repeating clock patterns such as 1010. Accordingly, frequency lock may be achieved more quickly than other known techniques. For example, for a Nyquist channel loss between 10 dB to 35 dB at the data rate of 10 Gbps, a locking range of 500,000 ppm may be achieved when the transmitter is sending a clock pattern and 30,000 ppm when the transmitter is sending a random non-return-to-zero (NRZ) data bit sequence. Moreover, frequency lock may be achieved in under 2 µs, and inter-symbol interference (ISI) induced jitter may be between about 1 to 5 picoseconds RMS depending on the channel loss.

Various timing recovery mechanisms may be distinguished by the manner in which they generate and process timing error produced by the phase detector to adjust the receiver clock. According to embodiments of the present disclosure, basic forms of timing error function is utilized for frequency acquisition, and a plurality of timing errors are used for phase optimization. Accordingly, the described techniques utilize a data slicer and an error slicer that work off of the same clock signal, and does not utilize a crossing slicer.

FIG. 1 illustrates an example block diagram of a slicer 102. In some embodiments, a slicer 102 works on the principal of comparing an input signal 104 (e.g., an analog voltage) with a threshold 106 and generating an output 108.

As illustrated, the slicer 102 receives an input signal 104 and generates an error output 108 based on a comparison result of the input signal 102 to a threshold 106. Accordingly, the slicer 102 outputs a +1 (e.g., a positive error) when the voltage of the input signal 104 is greater than the threshold 106, and −1 (e.g., a negative error) when the voltage of input signal 102 is less than the threshold 106. According to various embodiments of the present disclosure, the threshold for the data slicer is zero and the threshold for the error slicer is a threshold voltage that initially starts with a pre-determined threshold voltage Vth of about 100 to 400 mV, which is later adapted to optimize the sampling phase.

Figure 2:
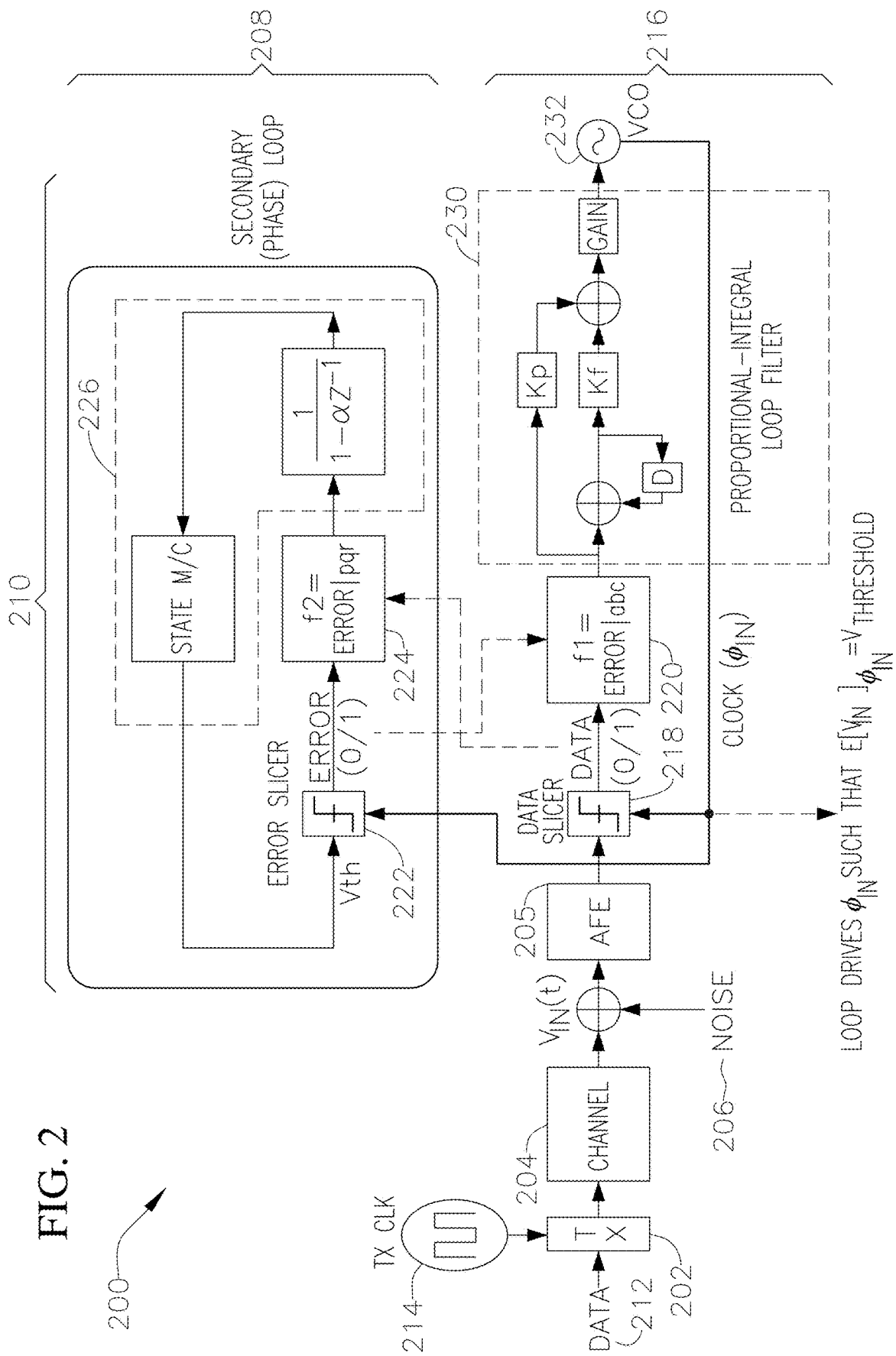
FIG. 2 is a block diagram of an example high speed serial link, according to various embodiments of the present disclosure.

FIG. 2 is a block diagram of an example high speed serial link, according to various embodiments of the present disclosure. The link includes a transmitter 202, a receiver 210, and a channel 204 connecting the transmitter 202 to the receiver 210. In some embodiments, the transmitter 202 may be a linear finite-impulse-response filter (FIR) and the receiver 210 may be a continuous-time linear equalizer (CTLE). Accordingly, the transmitter 202 uses a transmitter clock signal 214 to transmit a serial data signal 212 through the channel 204 to the receiver 210 as clock and data recovery (CDR) input $V_{in}(t)$. In some embodiments, noise 206 may be introduced into the CDR input.

In some embodiments, CDR input $V_{in}(t)$ can be calculated as follows:

$$V_{in}(t) = \Sigma_k d_k p(t-kT) + n(t),$$

where $d_k$ represents the transmit alphabet (+1/−1 for NRZ signaling), n(t) is the noise which is typically modelled as additive, white and Gaussian noise (AWGN), p(t) represents the pulse response of overall channel including analog front end (AFE), and k T represents time in steps of T seconds, where T is the symbol period. For example, the serial data signal 212 is sampled every T seconds (1 UI=T seconds) so the time sequence that the serial data signal 212 is sampled becomes T, 2T, 3T, and so on. The transmit sequence $d_k$ may be assumed to be independent and identically distributed (IID).

In some embodiments, the receiver 210 includes an analog front-end (AFE) 205, a frequency acquisition loop 216, and a phase adjustment loop 208. The AFE 205 may be any one of many front-end circuits that are known to those skilled in the art, and will be not be described in further detail here. According to an embodiment, phase adjustment by the phase adjustment loop 208 is performed automatically based on certain parameters, such as based on bit patterns of the input data bits. Accordingly, the frequency acquisition loop 216 and the phase adjustment loop 208 work off of each other to achieve different objectives, and when the two objectives meet, the receiver 210 becomes stable. For example, the objective of the frequency acquisition loop 216 may be to achieve a certain frequency, whereas the objective of the phase adjustment loop 208 may be to achieve a certain phase. Until the two objectives are met, the frequency acquisition loop 216 and the phase adjustment loop 208 continue striving to meet their own objectives. In some embodiments, the frequency acquisition loop 216 operates about 100 times faster than the phase adjustment loop 208.

In some embodiments, the frequency acquisition loop 216 includes a data slicer 218 configured to sample the data signal 212 received from the transmitter 202. In some embodiments, the threshold voltage is set to zero. Accordingly, the data slicer 218 outputs the received data signal. The output of the data slicer 218 may be coupled to a first error block 220, which will be described in more detail later.

The output of the first error block 220 may be coupled to a loop filter 230 (e.g., a proportional integral loop filter). In some embodiments, the loop filter 230 may be a standard loop filter that is configured to filter out noises that may be picked up, for example, when the data signal is transmitted over the channel 230. The filtered data signal is then outputted from the loop filter 230 to control a voltage-controlled oscillator (VCO) 232. The loop filter 230 may be a standard loop filter such as, for example a low-pass filter that is well known to those having ordinary skill in the art, and therefore the details will be omitted.

In some embodiments, the phase adjustment loop 208 includes an error slicer 222 and a second error block 224. The error slicer 222 may be similar to the example illustrated in FIG. 1, and behave similar to the data slicer 218 except the threshold is a threshold voltage that is initially set and then later adjusted for optimization.

Turning back to FIG. 2, the error slicer 222 receives an input signal from the VCO 232 and threshold voltage Vth as the comparison voltage. In some embodiments, the threshold voltage Vth may be a pre-determined arbitrary value greater than zero, such as, for example about 100 to 400 mV. In some embodiments, the pre-determined threshold voltage Vth may be set to a value that is about one-half of the peak input signal. However, the threshold voltage may be set to any value so long as the voltage is not set so low that the error values are predominantly +1 or set so high that the error values are predominantly −1.

In some embodiments, the error output from the error slicer 222 is provided to the first error block 220 in the frequency adjustment loop 216 and also to the second error block 222 in the phase adjustment loop 208. The first error block 220 may be configured to perform a first function f1 if a certain pattern (e.g., a pre-determined pattern) of bits is detected in the input data signal 212. Similarly, the same error output from error slicer 222 is also provided the second error block 224 in the phase adjustment loop 208. The second error block 224 may be configured to perform a second function f2 if a certain pattern (e.g., a pre-determined pattern) of bits is detected in the input data signal 212. In some embodiments, the first error block 220 and the second error block 224 are configured to look for different pattern of bits, which will be described in more detail later.

In some embodiments, when the pattern criteria is met for the first error block 220, the output of the second error block 224 is provided to a voltage threshold modification circuitry 226, which adjusts the threshold voltage Vth that is ultimately fed back to the error slicer 222. Accordingly, the phase adjustment loop 208 controls the threshold voltage Vth, and the threshold voltage Vth controls the error slicer 222. The error slicer 222 generates an error output, which is provided to both the first error block 220 and the second error block 224. Each of the first error block 220 and the second error block 224 perform different functions when their pattern criteria are met, and when the functions f1, f2, of the first error block 220 and the second error block 224 merge, the phase adjustment loop 208 and the frequency modification loop 216 are converged, the threshold voltage Vth in no longer updated, and frequency lock is achieved.

FIG. 3 is a table illustrating example cases for the error blocks. In the table, the primary loop refers to the frequency modification loop 216 and the secondary loop refers to the phase adjustment loop 208. Herein the present disclosure, the notation: $\overline{\text{Error}}|_{010}$ means that the average value of error is conditioned on Previous Data ($d_{n-1}$)=0, Current Data ($d_n$)=1, Next Data ($d_{n+1}$)=0. In other words, the function is performed only when a data pattern of 010 is detected. The notation "X" means that that bit can be a 0 or a 1. Thus, for example, the notation x1x for the primary loop means that the function does not care whether the previous data bit and the next data bit is a 1 or a 0, and instead, cares that the current data bit is a 1.

For example, in case #1, whenever the data signal 212 exhibits a 3-bit pattern of 011, then the error from the second error block 224 may be applied to the secondary loop. Differently from case #1, the error from the second error block 224 is applied to the secondary loop in case #2 only when the bit pattern is 110. In other words, if the bit pattern is not 110, then the secondary loop ignores the error. In case #3, the error from the second error block 224 may be applied to the secondary loop when the bit pattern corresponds to x10. In other words, the previous data is ignored and only the current data and the next data are screened such that the current data is 1 and the next data is 0. Similarly, in case #4, the error from the second error block 224 may be applied to the secondary loop when the bit pattern is a 01x. In other words, the next data is ignored and only the previous data and the current data are screened such that the previous data is 0 and the current data is 1. In this manner, the first error block 220 and the second error block 224 may take the same error output from the error slicer 222 but apply the error to its corresponding primary loop or secondary loop only when the bit pattern screening criteria is satisfied. It is noted that while four example cases are shown in FIG. 3 by way of example, other variations of bit patterns are also applicable.

Accordingly, the threshold voltage Vth in the phase adjustment loop 208 (i.e., secondary loop) may be adjusted by applying the error from the second error block 224 to the phase adjustment loop 208 until the frequency lock condition is achieved. Thus, for example, in case #1 and case #2, when the impulse response value $h_1=h_{-1}$, then frequency lock is achieved. In case #3, frequency lock is achieved when $h_1=0$ and in case #4, frequency lock is achieved when $h_{-1}=0$.

Turning back to FIG. 2, the error output from the error slicer 222 is also provided to the first error block 220 in the frequency adjustment loop 216. Similar to the second error block 224, the first error block 220 also screens for the pre-determined bit pattern. For example, as provided in FIG. 3, the first error block 220 may be configured to look for a x1x pattern, which means that anytime the current data bit is a 1, the error is applied to the frequency adjustment loop 216 (i.e., primary loop).

Figure 4:
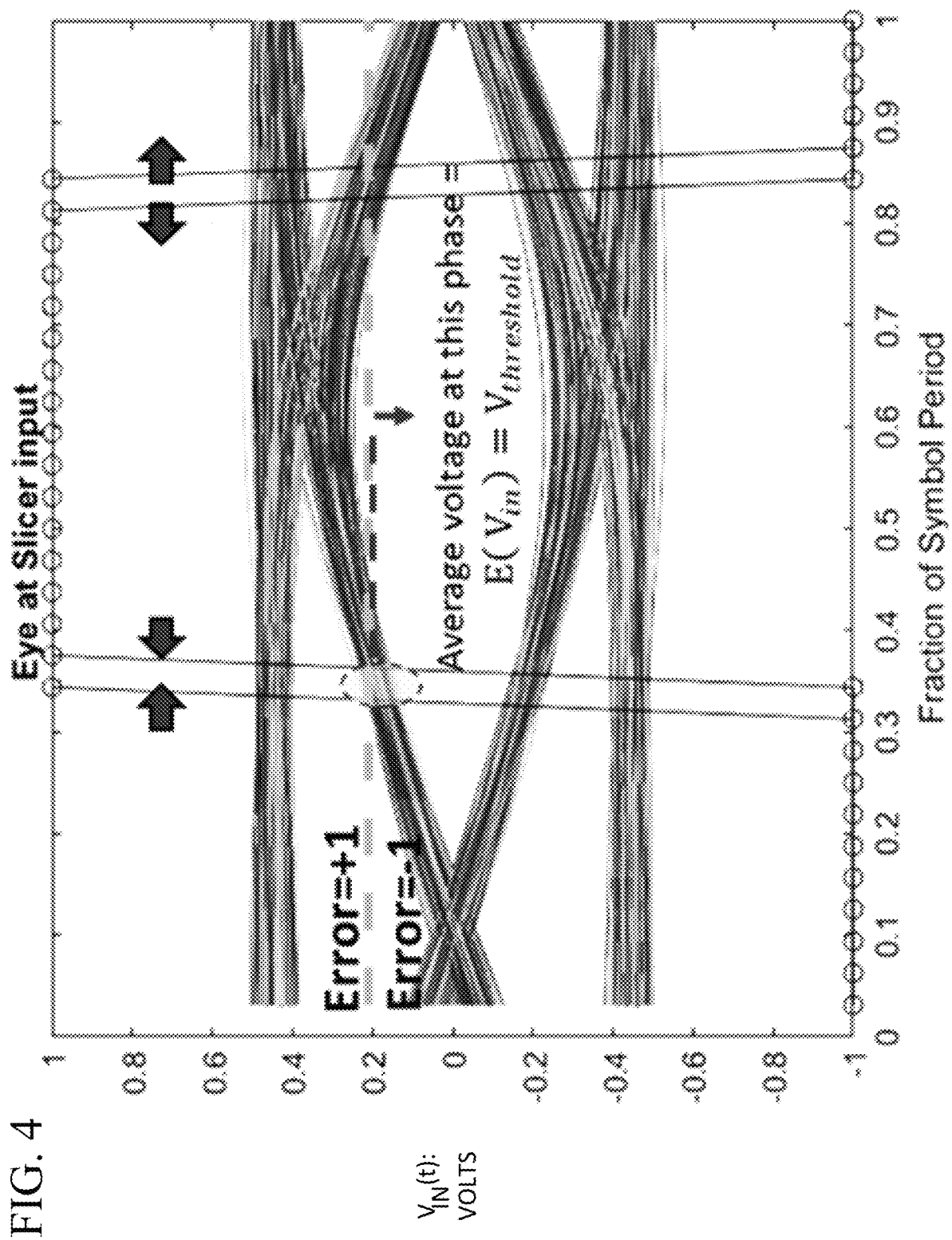
FIG. 4 is a diagram of an example data eye, according to various embodiments of the present disclosure.

In some embodiments, when the error from the first error block 220 is applied to the frequency adjustment loop 216, the error is filtered by the loop filter 230 (e.g., proportional-integral loop filter), and the output of loop filter 230 controls the VCO frequency as shown in FIG. 2. In some embodiments, an error value of +1 acts to increase the VCO frequency and an error value of −1 acts to decrease the VCO frequency. Thus, the error (i.e., timing error) information may be used to drive the timing recovery loop. Once the timing recovery achieves lock, the expected value of the signal voltage at the sampling instance $\overline{V}_{in}(\emptyset)$ is equal to the threshold as shown in FIG. 4. Here, FIG. 4 is a diagram of an example data eye, according to embodiments of the present disclosure. Here $\overline{V}_{in}(\emptyset)$ is defined as the average of signal voltage at the sampling instance.

In some embodiments, as shown in FIG. 3, the error signals into the VCO (or any other clock generation block) are conditioned based on a different bit pattern than the for the phase optimization loop. Therefore, although the error for both loops are the same output of the error slicer 222, the loops are conditioned on different patterns. The error information into the VCO loop affects frequency directly but the error into the phase optimization loop affects only the threshold voltage Vth, and the loop converges when timing error is driven to 0, such that the error into VCO loop=error into phase optimization loop. In some embodiments, the VCO loop is substantially faster (e.g., about 10 to 100 times) than the phase optimization loop to adjust the phase for the new threshold voltage Vth.

In some embodiments, the frequency acquisition loop 216 is able to acquire frequency lock even when the transmitter is sending data bits having a clock pattern (e.g., repeating 1010). This is advantageous because the initial portions of a data signal often include a clock pattern, and therefore, by acquiring frequency lock during this clock pattern, the amount of time it takes to achieve frequency lock may be improved (e.g., decreased) drastically. Although frequency lock may be achieved with random data sequences as described earlier, it is much faster to acquire frequency lock if the transmitter is sending a clock pattern which has lower inter symbol interference (ISI). In a Mueller-Muller phase detector, timing error information is given by $X_k*A_{k-1}-X_{k-1}*A_k$. Because only the sign information is available in a SerDes, this equation becomes $Sign(X_k)*d_{k-1}-Sign(X_{k-1})*d_k$, which for a 1010 pattern always results in a 0 which prevents any timing information from getting to the CDR. In various embodiments of the present disclosure, $E(V_{in})=V_{threshold}=h_0$, and therefore allows CDR to lock under a clock pattern (e.g., 1010). For example, a frequency lock may be achievable in under 2 μs with a starting ppm offset of 500,000 using the 1010 clock pattern.

In some embodiments, additional bit patterns such as the complements of the screening bit patterns shown in FIG. 3 may be implemented and an additional slicer may be included to achieve the same results. An example of the complemented screening bit patterns are shown in FIG. 5. Accordingly, the first error block 220 may be configured to apply the error to the primary loop when the bit pattern is x0x, which means when the current data bit is a zero. As can be seen, the bit pattern x0x is the complement of x1x. Similarly, the second error block 224 may be configured to apply the error to the secondary loop when the bit pattern is 100, 001, x01, 10x in cases #1-4 respectively, which is the complement of 001, 110, x10, 01x in cases #1-4 in FIG. 3. In some embodiments, such complementary screening may be performed by including an additional error slicer that is configured to look at the opposite polarity of the threshold voltage Vth. In other words, the error slicer utilized with the screening patterns shown in FIG. 3 looks at the positive threshold voltage +Vth to apply the error to the secondary loop. In some embodiments, another error slicer may be implemented to look at the negative threshold voltage −Vth and use the complemented screening bit patterns to achieve the same results. Accordingly, the bandwidth of the feedback loop may be doubled.

FIG. 6 is a flow chart illustrating a method for performing clock recovery, according to various embodiments of the present disclosure. Accordingly, in some embodiments, data values are generated by a data slicer 218 based on an input signal at step 602. Next, a first error signal is generated by a first error slicer 222 based on a comparison of a threshold voltage and an input voltage, at step 604. The first error signal may be selectively outputted by a first error block 220, in response to a first pattern in the output data values at step 606. Next, the first error signal may be selectively outputted by a second error block 224, in response to a second pattern in the outputted data values at step 608. Next, the threshold voltage may be adjusted by a voltage threshold modification circuitry 208, based on the output of the second error block 224 at step 610. The data slicer 218 and the first error slicer 222 may be clocked by a voltage-controlled oscillator 232 at step 612. In some embodiments, a frequency of the voltage-controlled oscillator 232 may be controlled by a loop filter 230 based on an output of the first error block 220. Accordingly, clock and data recovery may be performed in high speed serial links to jointly optimize the threshold voltage and the sampling phase to achieve target criteria.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware, to process data or digital signals. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Circuit hardware may include, for example, application specific integrated circuits (ASICs), general purpose or special purpose central processing units (CPUs) that is configured to execute instructions stored in a non-transitory storage medium, digital signal processors (DSPs), graphics processing units (GPUs), and programmable logic devices such as field programmable gate arrays (FPGAs).

Further, the various components of these devices may be a process or thread, running on one or more processors, in one or more computing devices, executing computer program instructions and interacting with other system components for performing the various functionalities described herein. The computer program instructions are stored in a memory that may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Embodiments described herein are examples only. One skilled in the art may recognize various alternative embodiments from those specifically disclosed. Those alternative embodiments are also intended to be within the scope of this disclosure. As such, the embodiments are limited only by the following claims and their equivalents.

What is claimed is:

1. A clock recovery circuit, comprising:
   a data slicer configured to output data values based on an input signal;
   a first error block;
   a phase adjustment loop, comprising:
      a first error slicer configured to generate a first error signal based on a comparison of a threshold voltage and an input voltage, wherein the first error block is configured to selectively output the first error signal in response to a first pattern in the output data values;
      a second error block configured to selectively output the first error signal in response to a second pattern in the output data values; and
      a voltage threshold modification circuitry configured to adjust the threshold voltage based on output of the second error block;
   a voltage-controlled oscillator, wherein the data slicer and the first error slicer are clocked based on output of the voltage-controlled oscillator; and
   a loop filter configured to control a frequency of the voltage-controlled oscillator based on output of the first error block.

2. The clock recovery circuit of claim 1, wherein the first error signal is a positive value in response to the input voltage being greater than the threshold voltage, or wherein the first error signal is a negative value in response to the input voltage being equal to or less than the threshold voltage.

3. The clock recovery circuit of claim 2, wherein the voltage threshold modification circuitry comprises a state machine configured to selectively increment the threshold voltage in response to the input voltage of the first error slicer being greater than the threshold voltage.

4. The clock recovery circuit of claim 3, wherein the input voltage of the first error slicer is an output of the voltage-controlled oscillator.

5. The clock recovery circuit of claim 4, wherein the threshold voltage is initially set based on a peak value of the input signal.

6. The clock recovery circuit of claim 1, wherein the first pattern and the second pattern are different patterns.

7. The clock recovery circuit of claim 6, wherein the first pattern and the second pattern each comprises 3 bits of the output data values.

8. The clock recovery circuit of claim 1, wherein the loop filter is a low-pass filter configured to filter noise from an output signal.

9. The clock recovery circuit of claim 1, wherein the phase adjustment loop further comprises a second error slicer configured to generate a second error signal based on a comparison of a negative value of the threshold voltage and the input voltage.

10. The clock recovery circuit of claim 9, wherein the first error block is further configured to selectively output an inverted second error signal in response to a third pattern in the output data values, wherein the third pattern is a complement of the first pattern.

11. The clock recovery circuit of claim 10, wherein the second error block is further configured to selectively output the second error signal in response to a fourth pattern in the output data values, wherein the fourth pattern is a complement of the second pattern.

12. A clock recovery method, comprising:
generating, by a data slicer, output data values based on an input signal;
generating, by a first error slicer, a first error signal based on a comparison of a threshold voltage and an input voltage;
selectively outputting, by a first error block, the first error signal in response to a first pattern in the output data values;
selectively outputting, by a second error block, the first error signal in response to a second pattern in the output data values;
adjusting the threshold voltage, by a voltage threshold modification circuitry, based on output of the second error block;
clocking, by a voltage-controlled oscillator, the data slicer and the first error slicer; and
controlling, by a loop filter, a frequency of the voltage-controlled oscillator based on output of the first error block.

13. The method of claim 12, wherein the first error signal is a positive value in response to the input voltage being greater than the threshold voltage, or wherein the first error signal is a negative value in response to the input voltage being equal to or less than the threshold voltage.

14. The method of claim 13, wherein the adjusting the threshold voltage further comprises selectively incrementing the threshold voltage in response to the input voltage of the first error slicer being greater than the threshold voltage.

15. The method of claim 14, wherein the input voltage of the first error slicer is an output of the voltage-controlled oscillator.

16. The method of claim 15, further comprising setting the threshold voltage initially based on a peak value of the input signal.

17. The method of claim 12, wherein the first pattern and the second pattern each comprises 3 bits of the output data values.

18. The method of claim 12, further comprising generating, by a second error slicer, a second error signal based on a comparison of a negative value of the threshold voltage and the input signal.

19. The method of claim 18, further comprising selectively outputting, by the first error block, an inverted second error signal in response to a third pattern in the output data values, wherein the third pattern is a complement of the first pattern.

20. The method of claim 19, further comprising selectively outputting, by the second error block, the second error signal in response to a fourth pattern in the output data values, wherein the fourth pattern is a complement of the second pattern.

* * * * *